United States Patent
Huang et al.

(10) Patent No.: US 9,177,815 B2
(45) Date of Patent: Nov. 3, 2015

(54) METHODS FOR CHEMICAL MECHANICAL PLANARIZATION OF PATTERNED WAFERS

(71) Applicant: APPLIED MATERIALS, INC., Santa Clara, CA (US)

(72) Inventors: Yi-Chiau Huang, Fremont, CA (US); Gregory Menk, Pleasanton, CA (US); Errol Antonio C. Sanchez, Tracy, CA (US); Bingxi Wood, Stanford, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 13/886,924

(22) Filed: May 3, 2013

(65) Prior Publication Data
US 2013/0295752 A1 Nov. 7, 2013

Related U.S. Application Data

(60) Provisional application No. 61/642,971, filed on May 4, 2012.

(51) Int. Cl.
*H01L 21/20* (2006.01)
*H01L 21/306* (2006.01)
*H01L 21/321* (2006.01)
*H01L 29/66* (2006.01)

(52) U.S. Cl.
CPC ...... *H01L 21/30625* (2013.01); *H01L 21/3212* (2013.01); *H01L 29/66795* (2013.01)

(58) Field of Classification Search
CPC ............ H01L 21/02532; H01L 21/02538; H01L 21/3212; H01L 21/30625
USPC .................................................. 438/691, 692
See application file for complete search history.

(56) References Cited

U.S. PATENT DOCUMENTS

| | | | | |
|---|---|---|---|---|
| 5,510,652 A | * | 4/1996 | Burke et al. | 257/752 |
| 6,245,642 B1 | * | 6/2001 | Satoh | 438/427 |
| 6,707,099 B2 | * | 3/2004 | Shiozawa et al. | 257/326 |
| 7,799,592 B2 | * | 9/2010 | Lochtefeld | 438/44 |
| 7,838,961 B2 | * | 11/2010 | Saitou et al. | 257/510 |
| 7,875,958 B2 | * | 1/2011 | Cheng et al. | 257/617 |
| 8,481,341 B2 | * | 7/2013 | Clark | 438/12 |
| 2003/0017705 A1 | * | 1/2003 | Rooyackers | 438/692 |

\* cited by examiner

*Primary Examiner* — Bryan Junge
(74) *Attorney, Agent, or Firm* — Moser Taboada; Alan Taboada

(57) ABSTRACT

Methods for chemical mechanical planarization of patterned wafers are provided herein. In some embodiments, methods of processing a substrate having a first surface and a plurality of recesses disposed within the first surface may include: depositing a first material into the plurality of recesses to predominantly fill the plurality of recesses with the first material; depositing a second material different from the first material into the plurality of recesses and atop the substrate to fill the plurality of recesses and to form a layer atop the first surface; and planarizing the second material using a first slurry in a chemical mechanical polishing tool until the first surface is reached. In some embodiments, a second slurry, different than the first slurry, is used to planarize the substrate to a first level.

14 Claims, 2 Drawing Sheets

METHODS FOR CHEMICAL MECHANICAL PLANARIZATION OF PATTERNED WAFERS

CROSS-REFERENCE TO RELATED APPLICATIONS

This application claims benefit of U.S. provisional patent application Ser. No. 61/642,971, filed May 4, 2012, which is herein incorporated by reference in its entirety.

FIELD

Embodiments of the present invention generally relate to substrate processing.

BACKGROUND

In the fabrication of non-planar transistors, silicon germanium alloys, especially germanium, may be deposited in trenches between shallow isolation features typically fabricated from a dielectric film such as undoped silicon oxide. The inventors have observed that, germanium films erode more readily than silicon films when employing conventional chemical mechanical planarization (CMP) techniques. As a result, film removal and uniformity control can be more difficult when using CMP techniques for germanium films than for silicon films. The same behavior may occur for films of germanium tin alloys and certain III-V alloys.

Accordingly, the present invention provides improved methods for chemical mechanical planarization of patterned wafers.

SUMMARY

Methods for chemical mechanical planarization of patterned wafers are provided herein. In some embodiments, a method of processing a substrate having a first surface and a plurality of recesses disposed within the first surface may include: depositing a first material into the plurality of recesses to predominantly fill the plurality of recesses with the first material; depositing a second material different from the first material into the plurality of recesses and atop the substrate to fill the plurality of recesses and to form a layer atop the first surface; and planarizing the second material using a first slurry in a chemical mechanical polishing tool until the first surface is reached.

In some embodiments, a method of processing a substrate having a silicon oxide layer and a plurality of recesses disposed within the silicon oxide layer may include depositing a germanium-containing material into the plurality of recesses to predominantly fill the plurality of recesses with the germanium-containing material; depositing a silicon-containing material into the plurality of recesses and atop the germanium-containing material to fill the plurality of recesses and to form a layer atop the silicon oxide layer; and planarizing the silicon-containing material using a first slurry in a chemical mechanical polishing tool; wherein the first slurry selectively terminates planarization upon reaching the silicon oxide layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
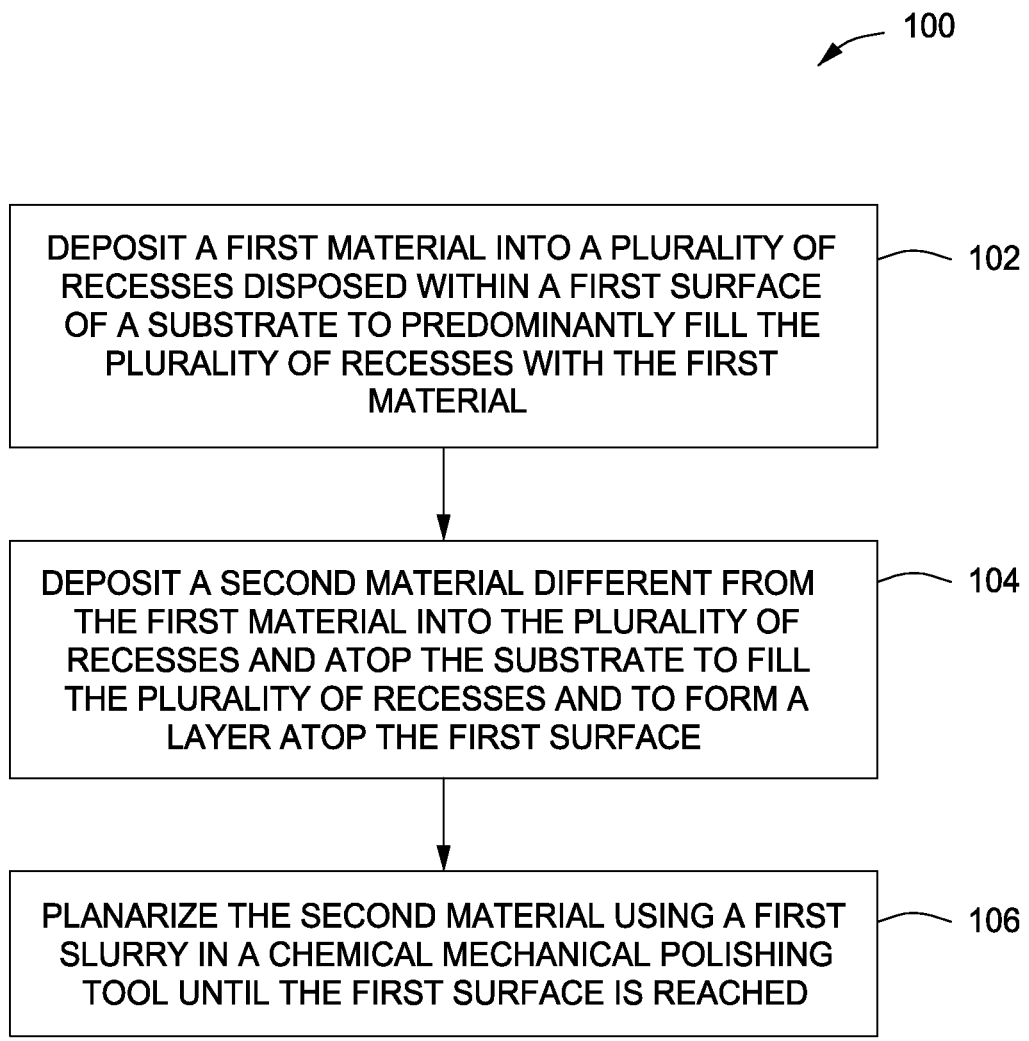
FIG. 1 depicts a method for chemical mechanical planarization of patterned wafers in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to methods for chemical mechanical planarization (CMP) of patterned wafers and more specifically to methods for advantageously protecting silicon germanium alloy films and germanium films from CMP slurries in the fabrication of non-planar transistors.

FIG. 1 depicts a method 100 for chemical mechanical planarization of patterned wafers in accordance with some embodiments of the present invention. FIGS. 2A-2E are illustrative cross-sectional views of a substrate during different stages of the processing sequence depicted in FIG. 1, in accordance with some embodiments of the present invention.

Figure 2A:
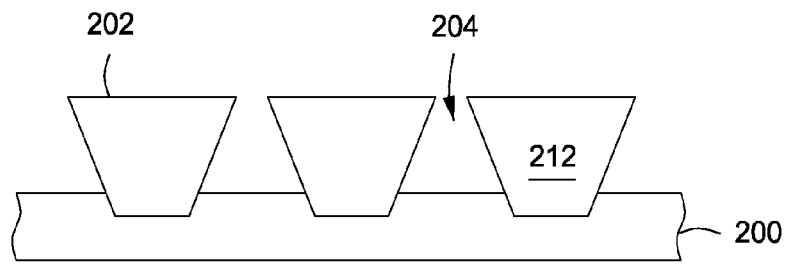
FIGS. 2A-2E are illustrative cross-sectional side views of a substrate during different stages of the method for chemical mechanical planarization of patterned wafers in accordance with some embodiments of the present invention.

The method 100 may be performed on a substrate, for example in the fabrication of non-planar transistors. In some embodiments, the substrate 200 has a first surface 202 and a plurality of recesses 204 disposed within the first surface, as depicted in FIG. 2A. The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the substrate 200 may comprise one or more layers, for example, a first layer 212. In some embodiments, the first layer 212 comprises a dielectric layer. The dielectric layer may comprise any dielectric materials suitable for substrate fabrication. For example in some embodiments, the dielectric layer may comprise silicon oxide ($SiO_2$), silicon nitride (SiN), a low-K material, or the like. In embodiments where the dielectric layer includes a low-k material, the low-k material may comprise carbon-doped dielectric materials (such as carbon-doped silicon oxide (SiOC), BLACK DIAMOND® dielectric material available from Applied Materials, Inc. of Santa Clara, Calif., or the like), an organic polymer (such as polyimide, parylene, or the like), organic doped silicon glass (OSG), fluorine doped silicon glass (FSG), or the like. The first layer 212 may be deposited in any suitable manner. For example, in some embodiments, the first layer 218 may be deposited via a chemical vapor deposition (CVD) process in a suitable process chamber. In some embodiments, the CVD chamber may be a standalone process chamber or a part of a cluster tool, such as one of the CENTURA®, PRODUCER®, or ENDURA® cluster tools available from Applied Materials, Inc. of Santa Clara, Calif.

In some embodiments, a plurality of recesses 204 may be formed in the first layer 212 such that an upper surface of substrate 200 may be exposed by the recesses 204 formed in the first layer 212. For example, an etching process may be performed to form the plurality of recesses 204 in the first layer 212. The plurality of recesses 204 generally comprises one or more sidewalls and a bottom and may be a via, a trench, or the like. For example, the plurality of recesses may correspond to regions where active channels in three-dimensional devices, such as FinFETs, are to be subsequently formed on the substrate. The plurality of recesses 204 may be formed through any suitable process, for example, such as an etch process. Although the plurality of recesses 204 may generally have any dimensions, in some embodiments, the plurality of recesses 204 may be a high aspect ratio feature, i.e., having a height to width aspect ratio of at least 4:1.

Figure 2B:
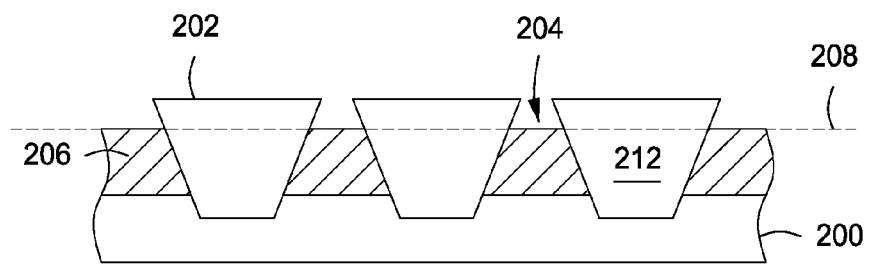

The method 100 generally begins at 102, where a first material 206 is deposited into each of the plurality of recesses 204 to predominantly fill each of the plurality of recesses 204 with the first material 206, as depicted in FIG. 2B. In some embodiments, the first material 206 comprises a silicon germanium alloy, germanium, a germanium tin alloy, a silicon-germanium-tin alloy, doped germanium, certain III-V alloy films, or the like. In some embodiments, the III-V alloy films include alloys composed of indium (In), gallium (Ga), phosphorus (P), arsenic (As), and antimony (Sb), such as an indium-gallium-arsenic alloy (InGaAs), a gallium-arsenic alloy (GaAs), an indium-phosphorus alloy (InP), an indium-gallium-antimony alloy (InGaSb), or the like. In some embodiments, the doped germanium may be doped with, for example, boron, phosphorus, arsenic or the like.

The first material 206 may be deposited in any suitable manner. For example, in some embodiments, the first material 206 may be deposited via a chemical vapor deposition (CVD) process, such as a thermal CVD epitaxy process, or other suitable process for filling the recesses 204 with the first material 206. The first material 206 is deposited within the recesses 204 up to a first level 208. In some embodiments, the first level 208 is below a first surface 202 of the first layer 212, as depicted in FIG. 2B.

Figure 2C:
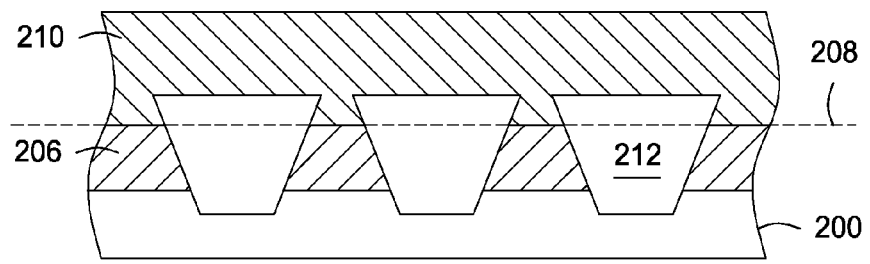

Next, at 104, a second material 210, different from the first material 206, is deposited into the recesses 204 and atop the substrate 200 to finish filling the recesses 204 and to form a layer atop the first surface 202, as depicted in FIG. 2C. In some embodiments, the second material 210 comprises silicon, polycrystalline silicon, amorphous silicon, silicon nitride, or the like. The second material 210 may be deposited in any suitable manner. For example, in some embodiments, the second material 210 may be deposited via a CVD or other suitable process, as discussed above. Deposition of the second material 210 atop the first material 206 advantageously prevents erosion of the first material 206 during a subsequent CMP process to planarize the top surface of the substrate.

Figure 2D:
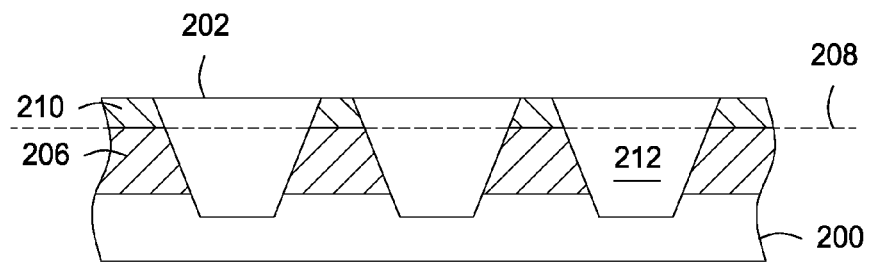
Figure 2E:
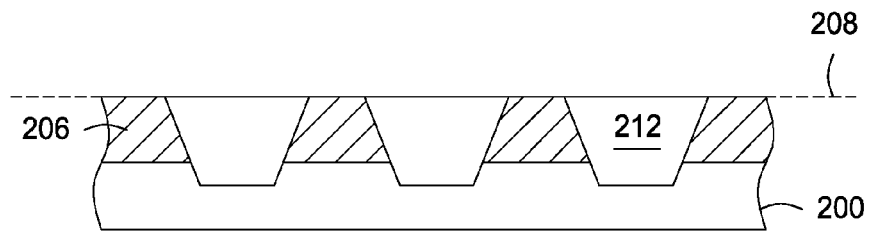

Next, at 106, the second material 210 is planarized using a CMP process using a first slurry. The second material 210 is planarized until the first surface 202 is reached, as depicted in FIG. 2D. The layer of second material 210 atop the first surface 202 may be completely removed, while some amount of second material 210 remains in each of the plurality of recesses 204 atop the substrate 200 to fill each of the plurality of recesses 204 to the planarized top surface. The second material 210 may be planarized using any suitable slurry for removal of the second material 210, for example, commercially available products such as Planerlite® 6103 or Planerlite® 6108, available from Fujimi Inc., other commercially available slurries such as from Asahi Glass Co., or the like, or combinations thereof.

The planarization process may be performed using chemical mechanical polishing process equipment, such as shown and described in U.S. Pat. Publication No. 2011/0256812, published Oct. 20, 2011 and entitled, "Closed-Loop Control for Improved Polishing Pad Profiles". The apparatus description provided therein is illustrative and should not be construed or interpreted as limiting the scope of this invention. In some embodiments, the CMP process may occur in standalone chamber or as part of a cluster tool, such as one of the CENTURA®, PRODUCER®, or ENDURA® cluster tools available from Applied Materials, Inc. of Santa Clara, Calif. In some embodiments, the CMP process may occur as part of a cluster tool that integrates a polisher with a post-polish cleaner, such as one of the Reflexion®, Reflexion® LK and Reflexion® GT tools available from Applied Materials, Inc.

In some embodiments, after the second material 210 is planarized, the method 100 may end and the substrate 200 may further be processed while a portion of the second material 210 remains atop the first material 206 filling each of the plurality of recesses 204. For example, the substrate 200 may be further processed to complete fabrication of devices being formed on the substrate. However, in some embodiments, a second CMP process may take place using a second slurry to planarize the second material 210 deposited in each of the plurality of recesses 204 and atop the substrate and to planarize the first surface 202 until the first level 208 of the first material 206 is reached. The choice of second slurry to be used is dependent upon the choice of the second material 210, the choice of the first material 206 and the material of the first layer 212. Depositing the second layer 210 atop the first layer 206 and using the first and second slurry in the planarization process advantageously avoids rapid planarization of the substrate while preventing erosion of the first material 206 as described herein. In some embodiments, the first slurry is used in a CMP process to planarize the second material 210 and the first surface 202 of the first material 206 until the first level 208 of the first material 206 is reached.

In some embodiments, a first layer 212 of silicon oxide is deposited atop a silicon substrate 200 via a CVD or other suitable process. A plurality of recesses 204 are formed in the silicon oxide layer 212 and then filled with germanium 206 to a level 208 below the top surface of the silicon oxide layer 212. A poly-silicon layer 210 is then deposited atop the silicon oxide layer 212 and atop the germanium material 206 within each of the plurality of recesses 204. The poly-silicon layer 210 advantageously protects the germanium material 206 from CMP slurries during subsequent planarization. The poly-silicon layer 210 is then planarized using a first slurry in a CMP tool. The first slurry is selected to selectively terminate planarization of the poly-silicon layer 210 upon reaching the silicon oxide layer 212, thereby preventing erosion of the germanium material 206. In some embodiments, the silicon substrate is then sent for further processing. In some embodiments, the first surface 202 of the silicon oxide layer and the poly-silicon material 210 atop the germanium material 206 in each of the plurality of recesses is planarized using a second slurry that selectively removes silicon and oxide with respect to germanium. A selectivity ratio of 1:1 (e.g., a ratio of respective removal rates) between the silicon oxide layer 212 and the poly-silicon material 210 atop the germanium material 206 in each of the plurality of recesses allows for planarization of both layers using the second slurry.

In some embodiments, the poly-silicon layer 210 atop the silicon oxide layer 212 and atop the germanium material 206 within each of the plurality of recesses 204 and the silicon oxide layer 212 is planarized, using only a first slurry that selectively removes silicon and oxide with respect to germanium, until the germanium layer 206 is exposed. A selectivity ratio of 1:1 between the silicon oxide layer 212 and the poly-silicon material 210 allows for planarization of both layers using only such a first slurry. In some embodiments, an optical endpoint system, such as the FULLVISION™ endpoint detection system available from Applied Materials, Inc., is used to terminate planarization at the germanium layer.

Thus, methods of chemical mechanical planarization of patterned wafers have been provided herein. The inventive methods may advantageously protect silicon germanium alloy films and germanium films from CMP slurries in the fabrication of non-planar transistors.

For example, in the fabrication of non-planar transistors, the channel materials can be Si, Si(x)Ge(1−x), Ge, Ge(x)Sn(1−x) or a III-V alloy and may be deposited in trenches between, and having some overburden above, the neighboring shallow trench isolation (STI) features. The STI features are typically fabricated from a dielectric film such as undoped silicon dioxide. Si(x)Ge(1−x) and especially Ge films can erode more readily than Si when employing conventional CMP slurries. As a result, film removal and uniformity control can be more difficult when polishing Si(x)Ge(1−x) and Ge films than for polishing Si. This is likely directly related to the chemical and mechanical properties of Ge as well as to the ability of a particular slurry to oxidize and etch the Ge film. The same behavior may also occur with Ge(x)Sn(1−x) and certain III-V alloy films. The present invention describes the deposition of a sacrificial cap layer on top of the channel material, currently envisioned to be deposited within trench features, and an approach to polishing the capping layer that prevents erosion or chemical attack of the channel material.

As discussed in more detail above, in some embodiments, the trenches are filled with Si(x)Ge(1−x), Ge, Ge(x)Sn(1−x) or a III-V alloy to slightly below the top of the trench, and then a sacrificial capping layer is deposited with the necessary overburden. Ge is used as the channel material in all of the following examples, but the invention can be employed with Si(x)Ge(1−x), Ge(x)Sn(1−x), and III-V alloy films as well. In one embodiment, an epitaxial silicon layer is deposited immediately after the Ge channel material, and a stop-on-oxide polish approach is used to remove the Si overburden and terminate the polish step (e.g., a first target level). In this manner the slurry and Ge film can always be separated so that the erosion of Ge caused by the slurry can be avoided. This approach could be used if the presence of a thin Si cap layer on top of the Ge fin structure does not degrade Ge FinFET electrical performance. In some embodiments, poly-Si, amorphous Si or another suitable sacrificial cap layer is deposited on the channel material, a stop-on-oxide polish approach is used to remove the sacrificial cap layer overburden (e.g., first target level), and a subsequent touch polish removes the remaining cap layer material as well as a thin layer of STI oxide (e.g., second target level), revealing the Ge channel material. This approach may employ a slurry that selectively removes Si, poly-Si or amorphous Si and oxide with respect to Ge, or that removes Ge at a low enough rate that erosion is minimal. Endpoint for the touch polish step may be effected with the a suitable endpoint system, such as the FULLVISION™ endpoint detection system. In some embodiments, a slurry may be employed that selectively removes the cap layer and oxide with respect to Ge, or that removes Ge at a low enough rate that erosion is minimal. The film stack is polished directly to the second target level, with an appropriate approach such as the FULLVISION™ endpoint system used to terminate the polishing process.

While the foregoing is directed to embodiments of the present invention, other and further embodiments of the invention may be devised without departing from the basic scope thereof.

The invention claimed is:

1. A method of processing a substrate having a first surface and a plurality of recesses disposed within the first surface, comprising:
    depositing a first material into the plurality of recesses to predominantly fill the plurality of recesses with the first material to a first level below the first surface;
    depositing a second material different from the first material into the plurality of recesses and atop the substrate to fill the plurality of recesses and to form a layer atop the first surface; and
    planarizing the second material using a first slurry in a chemical mechanical polishing tool until the first surface is reached; and
    planarizing the substrate using a second slurry in the chemical mechanical polishing tool until the first level is reached, wherein the second slurry is different than the first slurry;
    wherein the first material comprises a semiconductor alloy.

2. The method of claim 1, wherein the first material comprises one of a silicon-germanium alloy, a germanium-tin alloy, a silicon-germanium-tin alloy, or a III-V alloy.

3. The method of claim 2, wherein the III-V alloy is one of an indium-gallium-arsenic alloy (InGaAs), a gallium-arsenic alloy (GaAs), an indium-phosphorus (InP), or an indium-gallium-antimony alloy (InGaSb).

4. The method of claim 1, wherein the second material comprises silicon.

5. The method of claim 1, wherein the substrate includes a first layer comprising silicon oxide, and wherein the recesses are disposed within the first layer.

6. The method of claim 5, wherein the first layer includes a plurality of shallow trench isolation features disposed on the substrate.

7. The method of claim 1, wherein the first material comprises germanium and the second material comprises silicon.

8. The method of claim 1, wherein the plurality of recesses correspond to regions where active channels in a three-dimensional device are to be formed on the substrate.

9. The method of claim 1, wherein the plurality of recesses have a height to width aspect ratio of at least about 4:1.

10. A method of processing a substrate having a silicon oxide layer and a plurality of recesses disposed within the silicon oxide layer, comprising:
    depositing a germanium-containing material into the plurality of recesses to predominantly fill the plurality of recesses with the germanium-containing material to a first level below a first surface of the silicon oxide layer;
    depositing a silicon-containing material into the plurality of recesses and atop the germanium-containing material to fill the plurality of recesses and to form a layer atop the silicon oxide layer; and
    planarizing the silicon-containing material using a first slurry in a chemical mechanical polishing tool; wherein the first slurry selectively terminates planarization upon reaching the silicon oxide layer; and
    planarizinq the substrate using a second slurry in the chemical mechanical polishing tool until the first level is reached, wherein the second slurry is different than the first slurry.

11. The method of claim 10, wherein the silicon oxide layer is formed from a plurality of shallow trench isolation features disposed on the substrate.

12. The method of claim 10, further comprising depositing germanium into the plurality of recesses to predominantly fill the plurality of recesses with germanium material and depositing poly-silicon into the plurality of recesses and atop the substrate to fill the plurality of recesses and to form a layer atop the silicon oxide layer.

13. The method of claim 10, wherein the plurality of recesses have a height to width aspect ratio of at least about 4:1.

14. A method of processing a substrate having a silicon oxide layer and a plurality of recesses disposed within the silicon oxide layer, comprising:
   depositing a germanium-containing material into the plurality of recesses to predominantly fill the plurality of recesses with the germanium-containing material;
   depositing a silicon-containing material into the plurality of recesses and atop the germanium-containing material to fill the plurality of recesses and to form a layer atop the silicon oxide layer;
   planarizing the silicon-containing material using a first slurry in a chemical mechanical polishing tool; wherein the first slurry selectively terminates planarization upon reaching the silicon oxide layer; and
   planarizing the silicon-containing material within the plurality of recesses and the silicon oxide layer using a second slurry; wherein the selectivity ratio between the silicon-containing material and the silicon oxide layer is 1:1.

* * * * *